United States Patent
Takagi et al.

(10) Patent No.: US 11,470,002 B2
(45) Date of Patent: Oct. 11, 2022

(54) DATA COMPRESSION TRANSMISSION SYSTEM, INTERMEDIATE SERVER, METHOD, AND PROGRAM

(71) Applicant: NIPPON TELEGRAPH AND TELEPHONE CORPORATION, Tokyo (JP)

(72) Inventors: Masaru Takagi, Musashino (JP); Masahiro Yoshida, Musashino (JP); Koya Mori, Musashino (JP); Tomohiro Inoue, Musashino (JP); Hiroyuki Tanaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/432,303

(22) PCT Filed: Dec. 24, 2019

(86) PCT No.: PCT/JP2019/050620
§ 371 (c)(1),
(2) Date: Aug. 19, 2021

(87) PCT Pub. No.: WO2020/170601
PCT Pub. Date: Aug. 27, 2020

(65) Prior Publication Data
US 2022/0141135 A1 May 5, 2022

(30) Foreign Application Priority Data
Feb. 22, 2019 (JP) .............................. JP2019-030553

(51) Int. Cl.
*H04L 45/7453* (2022.01)
*H03M 7/42* (2006.01)
(Continued)

(52) U.S. Cl.
CPC .......... *H04L 45/7453* (2013.01); *H03M 7/42* (2013.01); *H04L 12/2836* (2013.01); *H04L 69/22* (2013.01)

(58) Field of Classification Search
None
See application file for complete search history.

(56) References Cited

U.S. PATENT DOCUMENTS 9,639,183 B2 * 5/2017 Fleck ................... G06F 3/04162
2005/0138563 A1 * 6/2005 Cromer ..................... G06F 8/64
715/735

(Continued)

OTHER PUBLICATIONS

A. Anand et al., "Packet Caches on Routers: The Implications of Universal Redundant Traffic Elimination," in Proc. of ACM SIGCOMM '08, 2008.
(Continued)

*Primary Examiner* — James A Edwards
(74) *Attorney, Agent, or Firm* — Harness, Dickey & Pierce, P.L.C.

(57) ABSTRACT

A technique for compressing and transmitting data without hampering real-time performance can be offered. In a data compression transmission system for collecting data generated by a plurality of devices at a central server via a network, an intermediate server is arranged between the devices and the central server. Each of the devices includes a packet cache processing unit for converting the generated data to a hash value based on a cache. The intermediate server includes a packet cache processing unit for decoding the hash value to original data based on the cache, a buffering unit for aggregating the data and outputting the data as a long packet, and a compression encoding unit for compressing the data and generating encoded data.

6 Claims, 12 Drawing Sheets

(51) Int. Cl.
*H04L 12/28* (2006.01)
*H04L 69/22* (2022.01)

(56) References Cited

U.S. PATENT DOCUMENTS

| | | | | |
|---|---|---|---|---|
| 2006/0129629 A1* | 6/2006 | Kawashima | .......... | H04L 61/301 |
| | | | | 709/203 |
| 2010/0274773 A1* | 10/2010 | Pawar | ................ | G06F 16/9535 |
| | | | | 707/693 |
| 2011/0225168 A1* | 9/2011 | Burroughs | ............ | G06F 9/3851 |
| | | | | 707/747 |
| 2015/0155968 A1* | 6/2015 | Grube | ................ | H03M 13/373 |
| | | | | 714/776 |
| 2019/0349426 A1* | 11/2019 | Smith | .................. | H04L 63/123 |

OTHER PUBLICATIONS

International Search Report issued in PCT/JP2019/050620, dated Mar. 24, 2020.

* cited by examiner

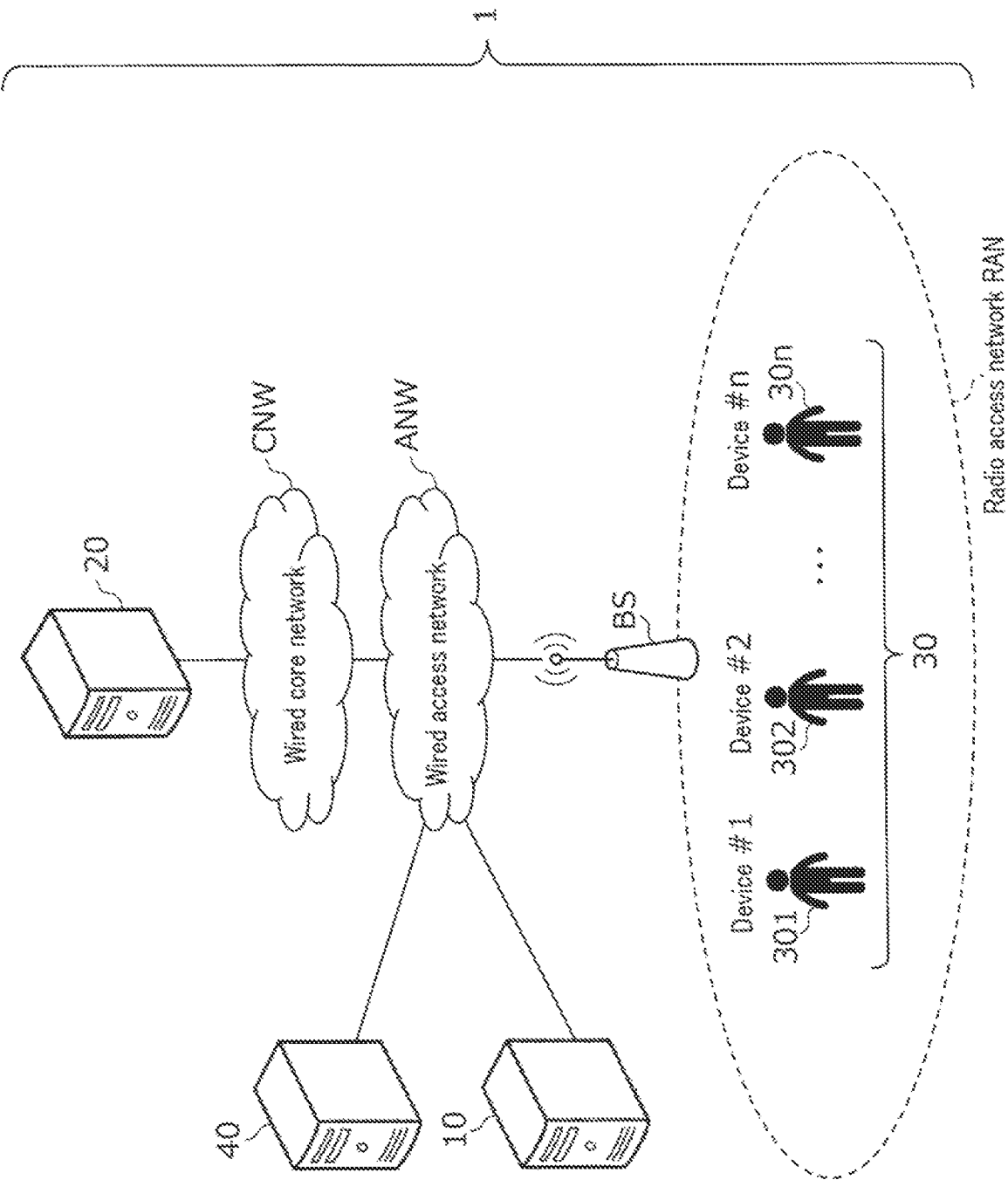
F I G. 1

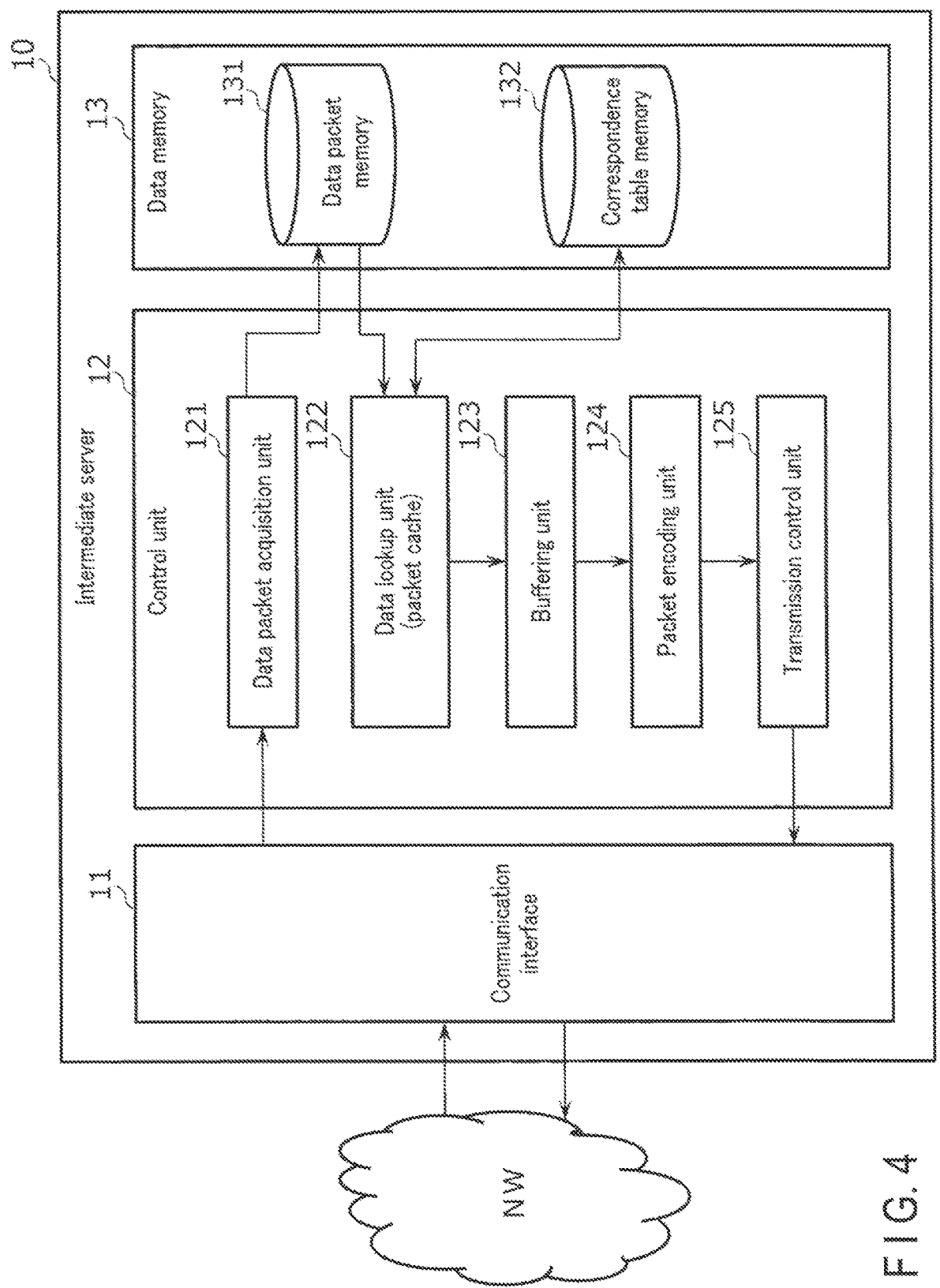
F I G. 4

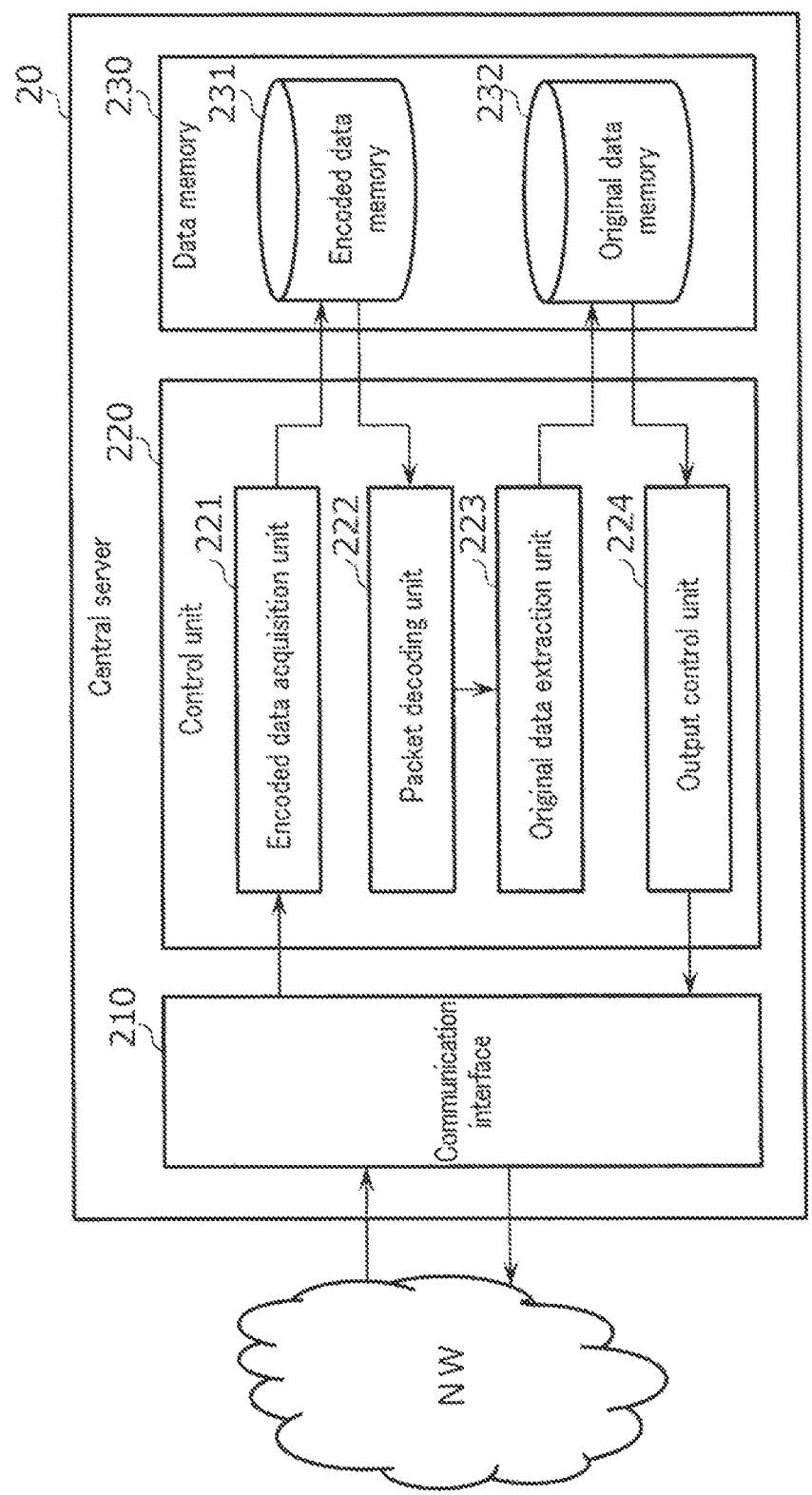
F I G. 5

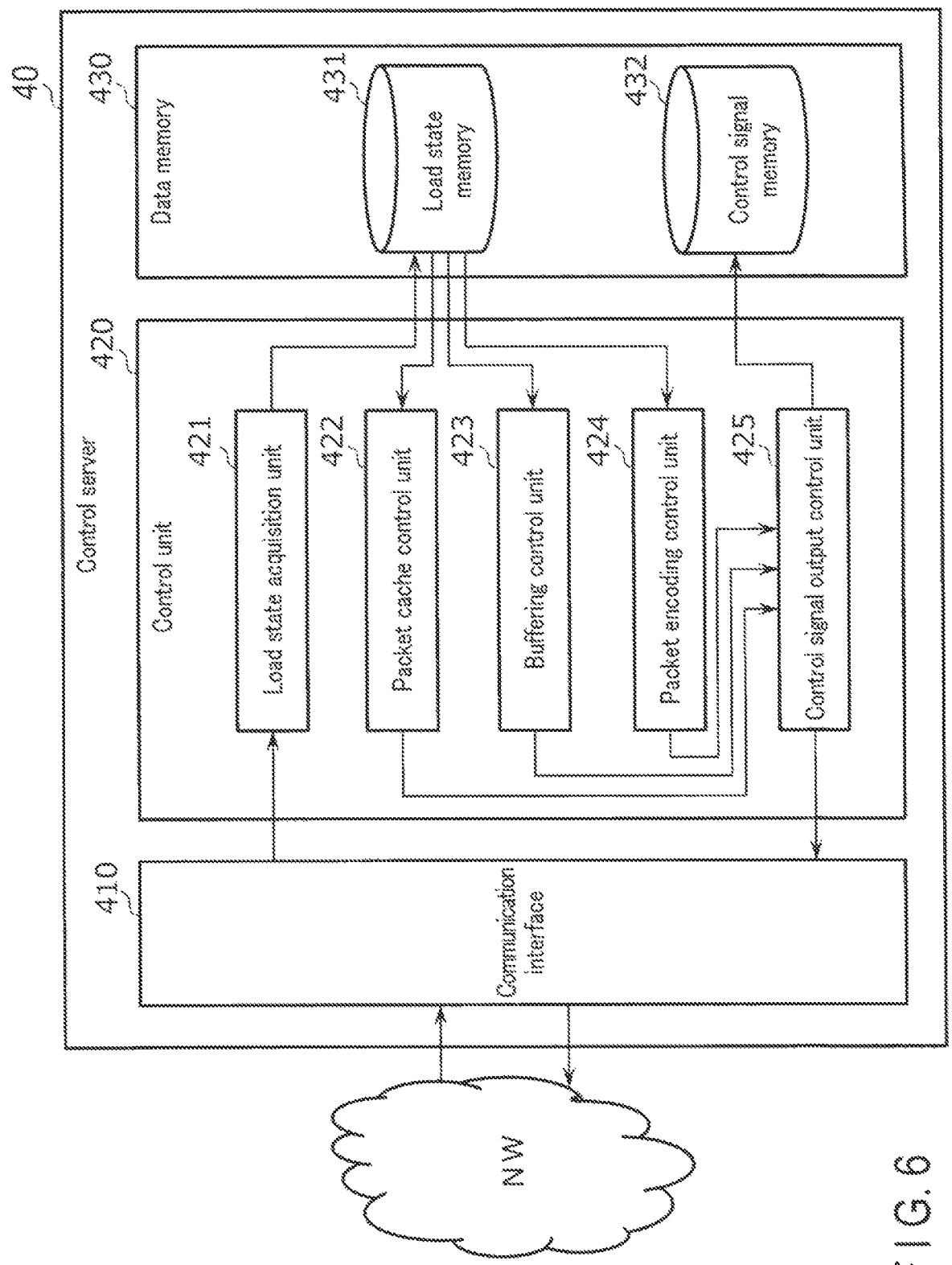
F I G. 6

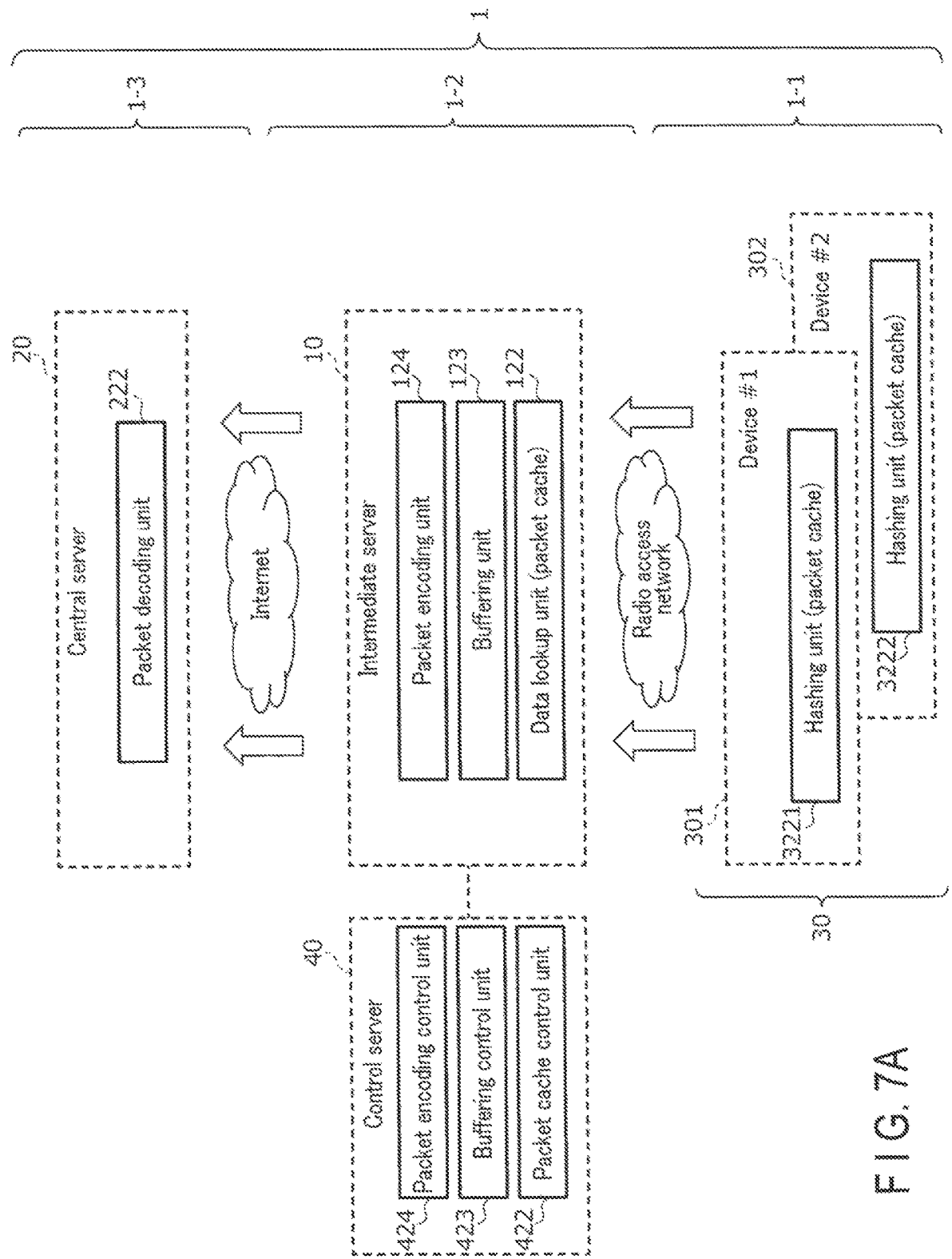
F I G. 7A

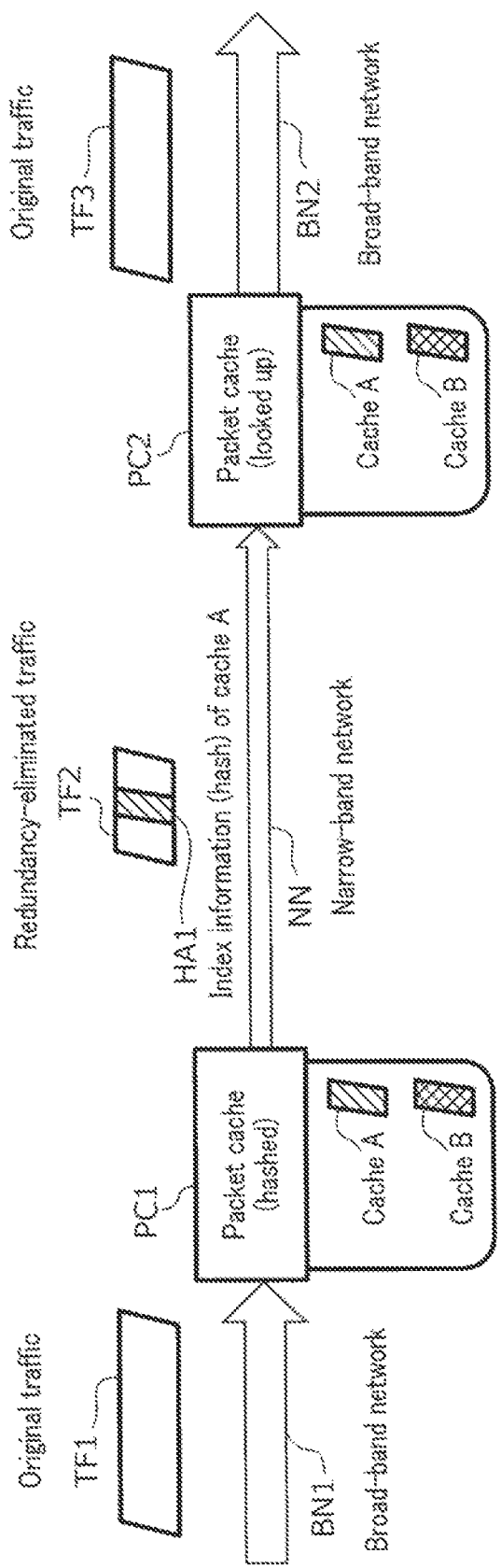
F I G. 8

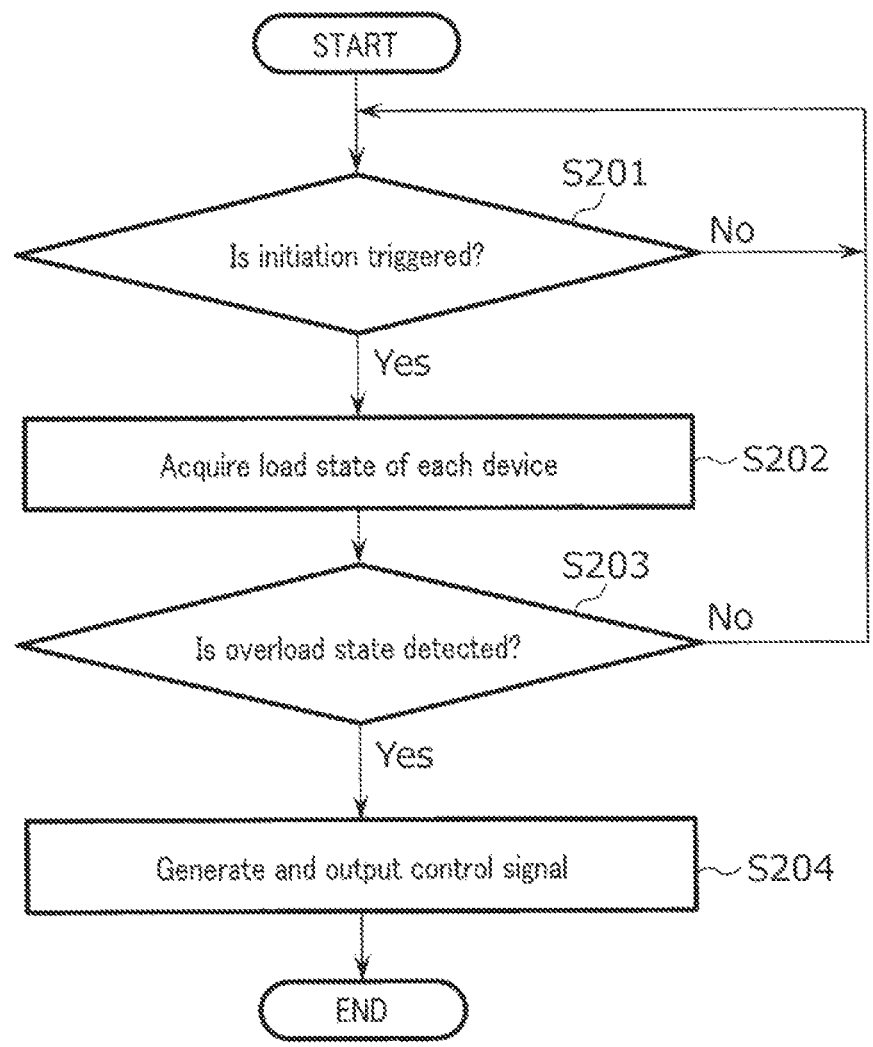
F I G. 9

DATA COMPRESSION TRANSMISSION SYSTEM, INTERMEDIATE SERVER, METHOD, AND PROGRAM

CROSS-REFERENCE TO RELATED APPLICATIONS

This is a U.S. national phase application under 35 USC 371 of International Application No. PCT/JP2019/050620, filed on Dec. 24, 2019, which claims priority to Japanese Application No. 2019-030553 filed on Feb. 22, 2019. The entire disclosures of the above applications are incorporated herein by reference.

FIELD

One aspect of the present invention relates generally to a data compression transmission system for collecting data generated by multiple devices at a central server via a network, as well as to an intermediate server, a method and a program employed in such a system.

BACKGROUND

With the recent spread of Internet of Things (IoT) technology, data collection and analysis adopting a wide variety of sensors have been advanced in fields such as the manufacturing industry, the automobile industry (autonomous driving support), and agriculture. In order to track the state of the surroundings measured by sensors and the state of the IoT device (which will be simply referred to as a "device" hereinafter) provided with these sensors, a scheme of transmitting and storing the information acquired by the sensors in real time in a central server (i.e., a computer arranged at the same place as the device or a cloud on the Internet) to create device shadows is effective.

A device shadow (thing shadow) denotes information indicating the state of a device that is transmitted to and stored in the central server in real time. The device shadows can realize control that is flexible with the states of devices through analysis of the stored information using the computer resources of the central server.

Types of data generating devices vary, and in addition, the number of devices is enormous. The information acquired by the sensors has characteristics of having a small per-unit data size and being frequently generated. For this reason, if information is collected from a large number of sensors, problems will be caused not only with the increased communication traffic, but also with the increased number of packets. Such problems produce a large load upon a network between the devices and the central server. Thus, a technique of efficiently compressing these frequently generated short packets is required in order to store in real time the information acquired by the sensors in the central server.

Packet caching has been suggested as a technique for compressing short packets that are frequently generated by the devices (see non-patent literature 1, for example). Packet caching is a method of eliminating the temporal redundancy included in the payload of transmitted and received communication packets. When no change occurs in the state of the surroundings, the device transmits information having an unchanged value to the central server. In such a case, the communication packets generated by the device have payloads of the same bit sequence. The payloads of the communication packets having the same bit sequence are regarded as a temporal redundancy, and therefore these payloads can be compressed to a smaller size through packet caching.

CITATION LIST

Non-Patent Literature

[NON-PATENT LITERATURE 1] A. Anand et al., "Packet Caches on Routers: The Implications of Universal Redundant Traffic Elimination," in Proc. of ACM SIGCOMM '08, 2008.

SUMMARY

Technical Problem

However, it is difficult to effectively reduce the communication traffic and the number of packets while ensuring the real-time performance by simply adopting packet caching.

The present invention has been conceived in light of the above circumstances. The invention aims to offer a technique of reducing the communication traffic and the number of packets without hampering the real-time performance.

Solution to Problem

In order to solve the above issue, according to the first aspect of the invention, a data compression transmission system for collecting data generated by a plurality of devices, at a central server via a network is offered. The system includes an intermediate server arranged between the devices and the central server. Each of the devices includes a hashing unit configured to perform a hashing process to convert the generated data to a hash value based on a cache; and a first transmission unit configured to generate a packet including the hash value and transmit the packet to the intermediate server. The intermediate server includes a reception unit configured to receive the packet transmitted from each of the devices; a data lookup unit configured to look up original data by the hash value included in the received packet; a buffering unit configured to perform a buffering process in a manner such that a plurality of pieces of the looked-up original data are aggregated and output as aggregated data; a compression encoding unit configured to perform a compression encoding process to compress the output aggregated data and generate encoded data; and a second transmission unit configured to transmit the encoded data to the central server.

Advantageous Effects of Invention

In a data compression transmission system, an intermediate server is arranged between a plurality of devices configured to generate data and convert the generated data to a hash value based on a cache and to generate and transmit a packet including the hash value and a central server configured to collect the data generated by the devices. The intermediate server includes a processing unit configured to look up original data by the hash value included in the received packet, a processing unit configured to aggregate a plurality of pieces of the looked-up original data and output it as aggregated data, a processing unit configured to compress the output aggregated data and generate encoded data, and a transmission unit configured to transmit the encoded data to the central server.

Through a hashing process executed at a plurality of devices based on a cache, the data size of to-be-transmitted packets can be reduced, and the communication traffic between the devices and the intermediate server can be eased. In addition, the intermediate server for collecting data from the devices is configured to perform looking up by a hash value based on the cache, buffering, and compression encoding. This makes it possible to aggregate data into an effective data size in a short period of time and compress the data on the intermediate server, thereby reducing the communication traffic between the intermediate server and central server as well as the number of packets. Thus, according to the first and fourth aspects of the invention, in a data compression transmission system including a plurality of devices, a central server, and an intermediate server arranged in between, the reduction in the communication traffic and the number of packets can be effectively realized, while ensuring the real-time performance, which is required in data collection from IoT devices.

That is, according to the present invention, a technique of reducing the communication traffic and the number of packets without hampering the real-time performance can be offered.

BRIEF DESCRIPTION OF THE DRAWINGS

FIG. 1 is a diagram showing the overall configuration of a data compression transmission system according to an embodiment of the present invention.

FIG. 4 is a block diagram showing a software configuration of the intermediate server in FIG. 3.

FIG. 5 is a block diagram showing the functional configuration of a central server in the data compression transmission system in FIG. 1.

FIG. 6 is a block diagram showing the functional configuration of a control server in the data compression transmission system in FIG. 1.

FIG. 7A is a diagram showing the overall functional configuration and data flow of the data compression transmission system according to the embodiment of the present invention.

FIG. 8 is a diagram showing the flow of the packet cache process.

FIG. 9 is a flowchart showing the procedure and descriptions of the process performed by the control server in FIG. 6.

DETAILED DESCRIPTION

Figure 2:
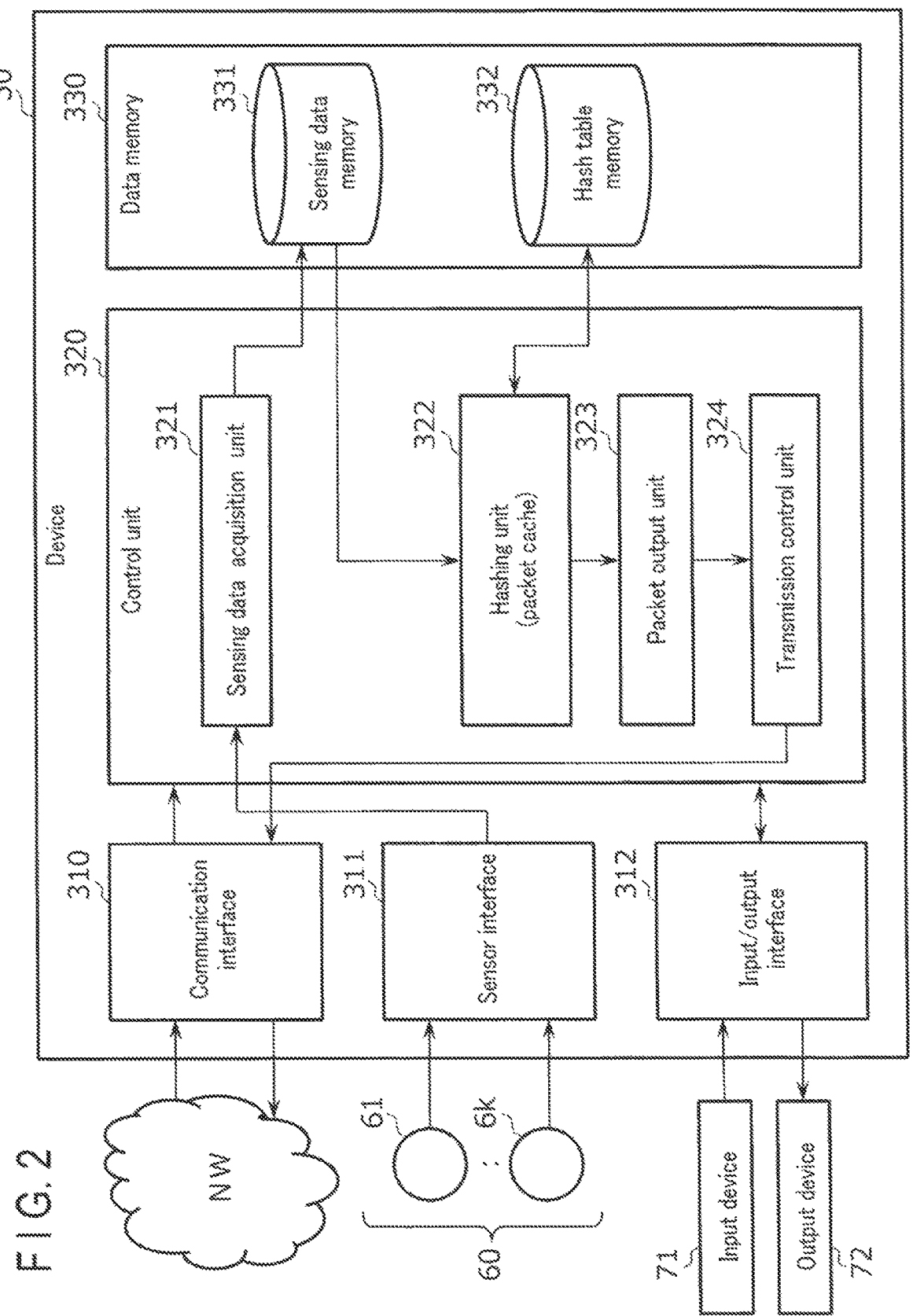
FIG. 2 is a block diagram showing the functional configuration of a device in the data compression transmission system in FIG. 1.

Embodiments of the present invention will be described below with reference to the drawings.

As mentioned above, it has been difficult to effectively reduce the communication traffic and the number of packets while ensuring the real-time performance with a conventional system. The following three issues may arise in the effort to compress short packets that are frequently generated by devices.

[Issue 1]

Short packets can be compressed by adopting packet caching, which can achieve reduction in communication traffic. This, however, does not lead to reduction in the number of packets to be communicated. If a large number of packets are to be communicated, a costly communication apparatus with an excellent packet processing capability is required as a communication apparatus in the central server, which will increase costs for data collection. In addition, the size of headers for TCP/IP or Ethernet (trademark) included in short packets will become non-negligible, lowering the overall communication efficiency. Thus, a method for concurrently reducing both the communication traffic and the number of to-be-communicated packets is desired.

[Issue 2]

The number of to-be-communicated packets can be reduced by buffering data on the devices. In general, data up to 1500 bytes can be stored in one packet on the Ethernet. The number of packets to be communicated can be reduced through data transmission after buffering the data until it reaches 1500 bytes. When the data generated by the devices is buffered, however, a delay time is produced due to a wait until a sufficient amount of data is collected. In a use case prioritizing the real-time performance, the frequently generated data needs to be transmitted in short packets, as is. A method for ensuring real-time performance, in addition to achieving the concurrent reduction in both the communication traffic and the number of to-be-communicated packets, is desired.

[Issue 3]

In the field of IoT or the like in which hundreds of millions of devices are involved, a vast number of network connections are established between the devices and the central server. With such a large number of network connections with the central server, connection problems including C10M may arise. C10M is the problem of the processing load of the server surpassing its processing capability when the number of connected clients increases, even if there is no hardware performance problem. When processes and threads corresponding to over several million connections are created, a management region for these processes and threads needs to be ensured on the memory of the server, which requires a large memory size. The cost for maintaining the connections are therefore increased. In order to avoid problems that tend to be caused by a large number of connections, the number of network connections with the central server needs to be reduced.

In view of Issues 1 to 3, the purpose of the embodiment is to offer a technique of reducing the communication traffic and the number of packets without hampering the real-time performance.

One Embodiment (Configuration)

(1) System

FIG. 1 is a diagram showing an example of the overall configuration of a data compression transmission system 1 according to an embodiment of the present invention.

This system 1 includes devices 301, 302, . . . and 30$n$ (hereinafter collectively referred to as "devices 30") communicable with a base station BS through a radio access network RAN, and a central server 20 communicable with the base station BS through a wired access network ANW, wired core network CNW, and the Internet or the like. An intermediate server 10 and a control server 40 are connected to the base station BS through the wired access network ANW in a communicable manner. A plurality of base stations BS and intermediate servers 10 are concurrently connectable to the central server 20. For the sake of simplicity, however, a single base station BS and a single intermediate server 10 are illustrated here.

The radio access network RAN may be a cellular network that operates under the 3G or 4G standard. The network, however, may be replaced with a Local Area Network (LAN). For the wired access network ANW and wired core network CNW, wired networks utilizing optical fibers, for example, may be used. The connection is not limited, however, to the configuration illustrated in FIG. 1, and any wireless network or wired network may be adopted. Hereinafter, the communication network may be simply referred to as a network NW.

The device 30 may be a wearable device having multiple sensors such as an electrocardiograph and a sphygmomanometer, which can generate sensing data based on the signals output by these sensors and transmit data with a near field communication capability or Internet communication capability. The devices 301, 302 . . . , and 30n can generate different types of sensing data from information obtained by the sensors configured to measure different types of information.

The central server 20 may be a server computer on the web or cloud managed and operated by an equipment producer or a service provider. The central server 20 collects and stores the sensing data generated by the devices 30 and executes specific processing on this sensing data.

The intermediate server 10 may be a server computer or a personal computer arranged between the devices 30 and the central server 20. According to the present embodiment, the intermediate server 10 is connected to the base station BS in a communicable manner so as to receive data transmitted by individual devices 30, execute a compressing process, and thereafter transmit the data to the central server 20.

The control server 40 may be a server computer or a personal computer. The control server 40 is configured to monitor the states of the CPUs and memories of the devices 30, central server 20 and the intermediate server 10, and control the processing of the computers in accordance with the load of each computer. The control server 40 is connected to the intermediate server 10 through a wired access network ANW such as LAN in a communicable manner. The control server 40 may be configured to exchange information with the devices 30 and with the central server 20 via the intermediate server 10, or to exchange information with the devices 30 and with the central server 20 in a directly communicable manner.

The configurations of the computers will be further explained below.

(2) Devices

FIG. 2 is a block diagram showing the hardware configuration of a device 30 representing the devices 301, 302 . . . , and 30n illustrated in FIG. 1, with a software configuration added.

The device 30 may include, as a hardware structure, a hardware processor, a program memory, a data memory 330, a communication interface 310, a sensor interface 311, an input/output interface 312, and a control unit 320.

An input device 71 and an output device 72 attached to the device 30 are connected to the input/output interface 312. The input/output interface 312 executes a process of capturing operational data input by a user on the input device 71 such as a keyboard and a touch panel, and outputting and displaying the display data onto the output device 72 adopting liquid crystal or electroluminescence (EL). For the input device 71 and output device 72, devices provided inside the device 30 may be used, or an input device and display device of a different information terminal communicable through a network may be used.

The sensor interface 311 receives sensing signals measured by sensors 61 to 6k that form a sensor group 60, and converts the received sensing signals to digital signals by an A/D converter.

The communication interface 310 includes at least one wired or wireless communication interface, allowing for transmission and reception of information with the base station BS and users' cellular communication terminals via a network NW under the control of the control unit 320. As a wired interface, a wired LAN may be employed. As a wireless interface, an interface adopting a low-power wireless data communication standard such as a wireless LAN or Bluetooth (registered trademark) may be employed.

For the data memory 330, a nonvolatile memory such as a hard disk drive (HDD) or solid state drive (SSD) in which writing and reading can be conducted at any time, and a volatile memory such as a random access memory (RAM) may be used in combination as a storage medium. The data memory 330 includes, as memory regions for realizing this embodiment, a sensing data memory 331 and a correspondence table memory 332.

The sensing data memory 331 is used for storing the generated sensing data.

The correspondence table memory 332 is used for storing a correspondence table indicating the correspondence between the original data and a hash value obtained by applying a specific hash function to this data. The correspondence table memory 332 also stores this hash function.

The memories 331 and 332 are not essential components. For instance, memories arranged in an external memory device such as a USB memory or in a memory device such as a cloud database server may be adopted.

The control unit 320 includes a hardware processor such as a CPU, a program memory, and a work memory for temporarily storing the data now being processed. As software functional processing units, the control unit 320 includes a sensing data generation unit 321, a packet-caching hashing unit 322, a packet output unit 323, and a transmission control unit 324. All of these functional processing units are realized by the hardware processor implementing the application programs stored in the program memory. The control unit 320 may be realized in any other form, including an integrated circuit such as an application specific integrated circuit (ASIC) and a field-programmable gate array (FPGA).

The sensing data generation unit 321 executes a process of acquiring digital signals via the sensor interface 311, generating sensing data through sampling at a certain sampling rate, and storing the generated sensing data in the sensing data memory 331.

The hashing unit 322 reads transmission target data from the sensing data memory 331, and executes a hashing process for hashing the data based on a cache. In particular, the hashing unit 322 determines whether the transmission target data is contained in the correspondence table stored in the correspondence table memory 332, and, if the data is contained in the correspondence table, converts the data to a hash value in accordance with the correspondence table and forwards the value to the packet output unit 323. In contrast, if the transmission target data is not contained in the correspondence table, the hashing unit 322 reads, for example a hash function stored in the correspondence table memory 332, obtains a hash value by applying this hash function to the data, and adds the relationship between the data and the hash value to the correspondence table (updates the correspondence table). In addition, the hashing unit 322 forwards to the packet output unit 323 the original data before being subjected to the hashing.

The packet output unit 323 executes a process of adding header information to the un-hashed original data received from the hashing unit 322 or to the data converted to a hash value, and forwards the data as a data packet to the transmission control unit 324.

The transmission control unit 324 executes a process of transmitting the received data packet to the intermediate server 10 via the communication interface 310 through the network NW.

(3) Intermediate Server (3-1) Hardware Configuration

Figure 3:
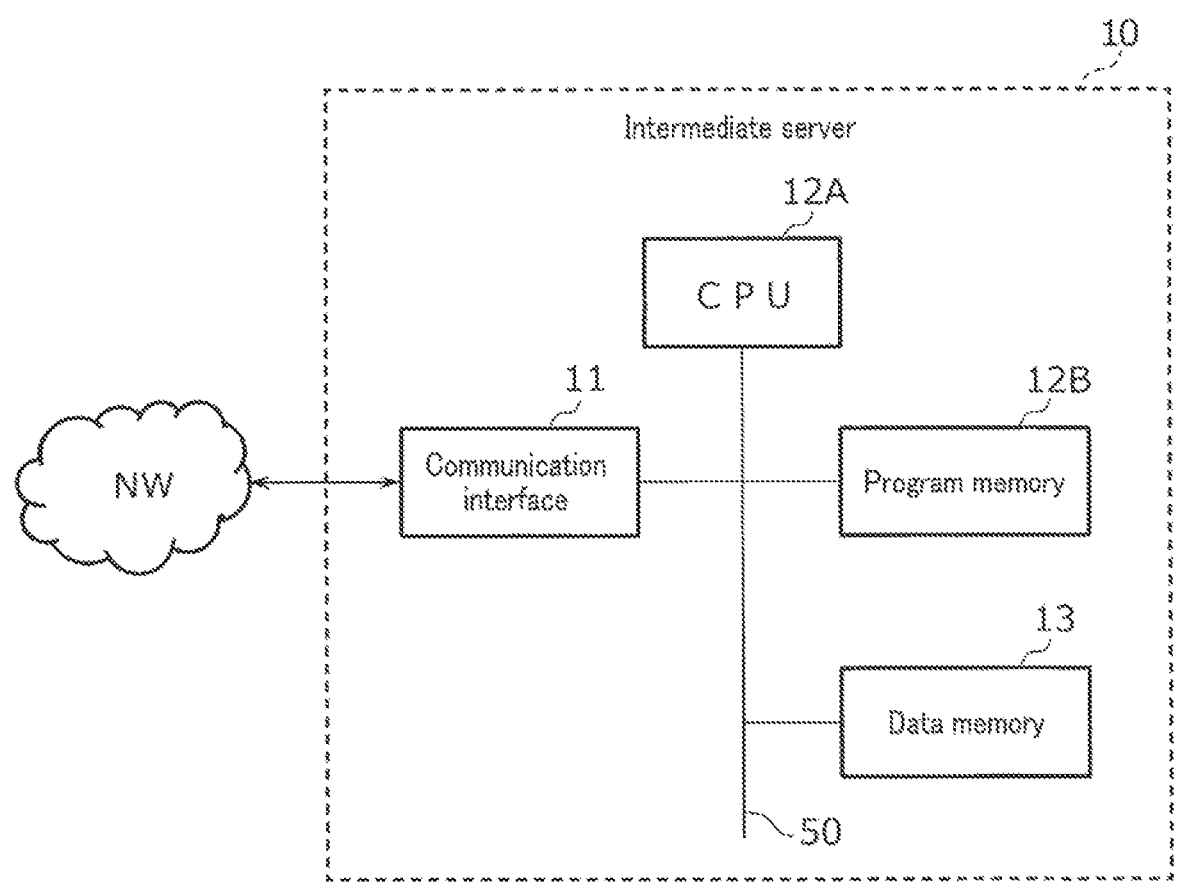
FIG. 3 is a block diagram showing a hardware configuration of an intermediate server in the data compression transmission system in FIG. 1.

FIG. 3 is a block diagram showing an exemplary hardware configuration of the intermediate server 10.

As a hardware configuration, the intermediate server 10 includes a hardware processor 12A such as a central processing unit (CPU) and a micro processing unit (MPU). Connected to this hardware processor 12A are a program memory 12B, a data memory 13, and a communication interface 11 by way of a bus 50.

The communication interface 11 includes at least one wired or wireless communication interface, allowing for transmission and reception of information through the network NW with the base station BS or a device 30, and with the central server 20. A wired LAN may be used as a wired interface, and a wireless LAN may be used as a wireless interface.

The program memory 12B serves as a storage medium and may be a combination of a nonvolatile memory such as a hard disk drive (HDD) or solid state drive (SSD), in which writing and reading can be conducted at any time, and a nonvolatile memory such as a ROM. Programs necessary to execute various types of control processing according to the embodiment are stored in the program memory 12B.

The data memory 13 serves as a storage medium, and may be a combination of a nonvolatile memory such as an HDD or SSD, in which writing and reading can be conducted at any time, and a volatile memory such as a RAM. The data memory 13 is used to store data of various types acquired and generated during the process.

(3-2) Software Configuration

FIG. 4 is a block diagram showing a software configuration of the intermediate server 10 according to the embodiment of the present invention, in association with the hardware configuration of FIG. 3.

A data packet memory 131 and a correspondence table memory 132 are provided in the memory region of the data memory 13.

The data packet memory 131 is used for storing the captured data packet.

The correspondence table memory 132 is used for storing a correspondence table indicating the correspondence between the original data and a hash value obtained by applying a specific hash function to this data. The correspondence table memory 132 also stores this hash function.

The memories 131 and 132 are not essential components. For instance, memories arranged in an external memory device such as a USB memory or in a memory device such as a cloud database server may be adopted.

The control unit 12 includes the above hardware processor 12A and program memory 12B. As software functional processing units, the control unit 12 includes a data packet acquisition unit 121, a data lookup unit 122 serving as a packet cache, a buffering unit 123, a packet encoding unit 124 serving as a compression encoding unit, and a transmission control unit 125. These functional processing units can be realized by the hardware processor 12A implementing the programs stored in the program memory 12B. The control unit 12 may also be implemented in various other forms, including integrated circuits such as ASIC and FPGA.

The data packet acquisition unit 121 executes, as a reception unit, a process of acquiring data packets transmitted by the devices 30 via the communication interface 11 and storing the acquired data packets in the data packet memory 131.

The data lookup unit 122 executes a process of sequentially reading the data packets from the data packet memory 131, deleting the header information, and restoring the original data based on the cache. In particular, the data lookup unit 122 determines whether the remaining data (key) after the deletion of the header information from the target data packet is contained in the correspondence table stored in the correspondence table memory 132. If the key is contained in the correspondence table, the data lookup unit 122 converts the hash value to the original data in accordance with the correspondence table, and forwards the data to the buffering unit 123. If the data is not contained in the correspondence table, the data lookup unit 122 forwards this data to the buffering unit 123, reads a hash function stored in the correspondence table memory 132, acquires a hash value by applying the hash function to the data, and adds the relationship between this data and the hash value to the correspondence table (updates the correspondence table).

The buffering unit 123 executes a process of aggregating multiple items of the original data looked up by the data lookup unit 122 and outputting the aggregated data. In particular, the buffering unit 123 executes a process of buffering the data received from the data lookup unit 122 until the data reaches a certain size, generating a long packet, and forwarding the long packet to the packet encoding unit 124. The buffering unit 123 may perform the buffering until the data size reaches 1440 bytes so that the data can be stored in a single Ethernet frame.

The packet encoding unit 124 executes, as a compression encoding unit, a process of compressing by applying a compression scheme utilizing an information source encoding algorithm such as gzip to the long packet received from the buffering unit 123 to generate the encoded data, and forwarding the data to the transmission control unit 125.

The transmission control unit 125 executes, as a transmission unit, a process of transmitting the encoded data received from the packet encoding unit 124, to the central server 20 via the communication interface 11 through the network NW.

(4) Central Server

FIG. 5 is a block diagram showing the hardware configuration of the central server 20 according to the embodiment with the software configuration added.

The central server 20 may include, as a hardware configuration, a hardware processor, a program memory, a data memory 230, and a communication interface 210.

The communication interface 210 may include a wired or wireless interface, allowing for transmission and reception of information with an external device through the network NW, under the control of the control unit 220. As a wired interface, a wired LAN may be used, and as a wireless interface, a wireless LAN may be used.

The data memory 230 includes as a storage medium, a nonvolatile memory such as an HDD or SSD in which writing and reading can be conducted at any time, and a volatile memory such as a RAM. As memory regions for realizing this embodiment, the data memory 230 includes an encoded data memory 231 and an original data memory 232.

The encoded data memory 231 is used for storing the encoded data received from the intermediate server 10.

The original data memory 232 is used for storing the looked-up original data.

The memories 231 and 232 are not essential components. For instance, memories arranged in an external memory device such as a USB memory or in a memory device such as a cloud database server may be adopted.

The control unit 220 includes a hardware processor such as a CPU, a program memory, and a work memory for temporarily storing the data now being processed. As software functional processing units, the control unit 220 includes an encoded data acquisition unit 221, a packet decoding unit 222, an original data extraction unit 223, and an output control unit 224. All of these functional processing units are realized by the hardware processor implementing the application programs stored in the program memory. The control unit 220 may also be implemented in various other forms, including integrated circuits such as ASIC and FPGA.

The encoded data acquisition unit 221 executes a process of acquiring the encoded data transmitted from the intermediate server 10, and storing the data in the encoded data memory 231.

The packet decoding unit 222 executes a process of sequentially reading the encoded data stored in the encoded data memory 231, decoding (decompressing) the data to generate a long packet of the pre-encoding state, and forwarding the long packet to the original data extraction unit 223.

The original data extraction unit 223 executes a process of extracting the original data from the generated long packet, and storing the original data in the original data memory 232.

The output control unit 224 executes a process of outputting the data accumulated in the original data memory 232 in response to a request from the operator or the like.

(5) Control Server

FIG. 6 is a block diagram showing the hardware configuration of the control server 40 according to the embodiment with the software configuration added.

The control server 40 may include, as a hardware configuration, a hardware processor, a program memory, a data memory 430, and a communication interface 410.

The communication interface 410 may include a wired or wireless interface, allowing for transmission and reception of information with an external device through the network NW under the control of the control unit 420. As a wired interface, a wired LAN may be used, and as a wireless interface, a wireless LAN may be used.

The data memory 430 includes as a storage medium, a nonvolatile memory such as an HDD or SSD in which writing and reading can be conducted at any time, and a volatile memory such as a RAM. As memory regions for realizing this embodiment, a load state memory 431 and a control signal memory 432 are included.

The load state memory 431 is used for storing the acquired load state of each computer.

The control signal memory 432 is used for storing generated control signals.

The memories 431 and 432 are not essential components. For instance, memories arranged in an external memory device such as a USB memory or in a memory device such as a cloud database server may be adopted.

The control unit 420 includes a hardware processor such as a CPU, a program memory, and a work memory for temporarily storing the data now being processed. As software functional processing units, the control unit 420 includes a load state acquisition unit 421, a packet cache control unit 422, a buffering control unit 423, a packet encoding control unit 424, and a control signal output control unit 425. All of these functional processing units are realized by the hardware processor implementing the application programs stored in the program memory. The control unit 420 may also be implemented in various other forms, including integrated circuits such as ASIC and FPGA.

The load state acquisition unit 421 executes a process of acquiring the load states of the respective computers (devices 30, central server 20 and intermediate server 10) that are monitoring targets, and storing the states in the load state memory 431.

The packet cache control unit 422, buffering control unit 423, and packet encoding control unit 424 have a capability of monitoring the states of the CPUs and memories of the device 30, intermediate server 10 and central server 20, and determining whether to perform caching, buffering, and packet encoding on the corresponding computers in accordance with the load state of the respective computers.

The packet cache control unit 422 executes a process of reading information from the load state memory 431, determining whether to perform data compression through packet caching, and switching between performing data compression and not performing data compression. The compression through packet caching requires computer resources (CPU and memory, in particular), and therefore the computer will become overloaded if there is no surplus in the computer resources. If there is no surplus in the resources of the computers such as the devices 30, intermediate server 10, and central server 20, the packet cache control unit 422 exerts control in a manner such that the data is transferred in a non-compressed state to the next server, without performing packet caching.

The buffering control unit 423 executes a process of reading information from the load state memory 431, determining whether to perform buffering, and switching between performing buffering and not performing buffering. Buffering requires computer resources (memory, in particular), and therefore the computer will become overloaded if there is no surplus in the computer resources. If there is no surplus in the resources of the computers such as the devices 30, intermediate server 10, and central server 20, the buffering control unit 423 exerts control in a manner such that small-sized data is transferred to the next server without performing buffering.

The packet encoding control unit 424 executes a process of reading information from the load state memory 431, determining whether to perform data compression through packet encoding, and switching between performing data compression and not performing data compression. The compression with packet encoding requires computer resources (CPU and memory, in particular), and therefore the computer will become overloaded if there is no surplus in the computer resources. When there is no surplus in the resources of the computers such as the devices 30, intermediate server 10, and central server 20, the packet encoding control unit 424 exerts control in a manner such that the data is transferred in a non-compressed state to the next server, without performing packet encoding.

The control signal output control unit 425 executes a process of receiving the results of the determinations from the packet cache control unit 422, buffering control unit 423, and packet encoding control unit 424, generating control signals for executing or terminating the corresponding processes, storing the signals as history information in the control signal memory 432, and outputting them via the communication interface 410 to transmit to the computers.

(Operations)

(1) System

Next, the overall processing operation for data compression and transmission by the data compression transmission system 1 configured as above will be explained below. FIGS. 7A to 7D show the processing flow and descriptions of the data compression and transmission process, as well as its data flow.

FIG. 7A shows the overall processing flow of the data compression transmission system 1.

The section between the device 30 and the intermediate server 10 in FIG. 7A adopts a radio access network, and the section between the intermediate server 10 and the central server 20 adopts the Internet. The configuration of FIG. 7A, however, is presented as a mere example, and the network pattern to which the embodiment of the invention is applied is not limited to a wireless network or the Internet (the embodiment is equally applicable to WiFi, millimeter waves, or a wired network adopting optical lines or the like).

As mentioned above, the data compression transmission system 1 according to the embodiment includes a plurality of devices 30 (301, 302 . . . ), the intermediate server 10, the central server 20, and the control server 40. In the data compression transmission system 1, each device 30 includes a hashing unit 3221, 3222, . . . for the packet caching capability. The intermediate server 10 includes a data lookup unit 122, a buffering unit 123, and a packet encoding unit 124 for the packet caching capability. The central server 20 includes a packet decoding unit 222. The control server 40 includes a packet cache control unit 422, a buffering control unit 423, and a packet encoding control unit 424.

In packet caching, data for transmission and reception is cached, and if the transmission of the same data is repeated, the data is converted to a small-sized hash for transmission. In this manner, the communication traffic can be reduced. When the device 30 repeats the transmission of the same data to the intermediate server 10, temporal redundancy occurs in the data. Thus, with packet caching, the communication traffic can be reduced. In the example of FIG. 7A, the traffic in the radio access network corresponding to the section between the device 30 and the intermediate server 10 can be reduced by packet caching.

In order to perform packet caching, the devices for transmission and reception (e.g., the first device 301 and intermediate server 10) need to share a common function (hash function) in advance. When new data is transmitted, the devices (device 301 and intermediate server 10) obtain a hash value corresponding to this data based on the same hash function, and create a correspondence table of the hash value and data in the respective devices. When the same data is received next time, the transmission device (device 301) converts the data to a hash value based on the correspondence table, and the reception device (intermediate server 10) looks up the original data, also based on the correspondence table. In general, in an IoT device 30, the data that can be compressed by packet caching is often limited to very recent data since the capacity of the correspondence table to be stored is limited.

Next, by buffering the data for transmission and reception and converting small-sized data to large-sized data, plural items of small-sized data can be combined into a single item of large-sized data. In this manner, the number of packets to be communicated can be reduced. When the device 30 repeats the transmission of a short packet to the central server 20, the short packet can be buffered and converted to a long packet so that the number of packets can be reduced.

Packet encoding compresses large-sized data with a compression scheme employing an information source encoding algorithm such as gzip. In general, for large-sized data, packet encoding attains a higher compression efficiency than packet caching does. Packet caching is a scheme for compressing temporal redundancy indicating repeated transmissions of the same data in the past. If the data is small, the possibility of repeating the transmission of the same data is high. If the data is large, data having a 1-byte difference is handled as different data. The compression with packet caching therefore will not prove to be effective. Instead, by performing the compression with packet encoding upon the data the size of which has increased through buffering, the effective compression can be realized overall.

The control units 422 to 424 of the control server 40 respectively monitor the states of the CPUs and memories of the devices 30, intermediate server 10 and central server 20, and determine and control whether to perform caching, buffering and packet encoding at the computers in accordance with the loads of the computers.

The control server 40, however, is not an essential component of the data compression transmission system 1. The load state acquisition unit 421, packet cache control unit 422, buffering control unit 423, packet encoding control unit 424, and control signal output control unit 425 in the control server 40 may be provided at any location inside the data compression transmission system 1. For instance, all of the packet cache control unit 422, buffering control unit 423, and packet encoding control unit 424 may be provided in the control unit 12 of the intermediate server 10 or in the control unit 220 of the central server 20. Alternatively, these units may be configured as independent devices.

As mentioned above, the intermediate server 10 is a server arranged on the communication path connecting the devices 30 and the central server 20. The intermediate server 10 has a computing capability, and can activate the packet cache control unit 422, the buffering control unit 423, and the packet encoding control unit 424 and the like, in addition to the packet-cached data lookup unit 122, buffering unit 123, and packet encoding unit 124, which serve as a packet cache. A larger number of intermediate servers 10 than the number of central servers 20 may be employed. For instance, if intermediate servers 10 are installed at wireless base stations BS of a mobile network, hundreds of thousands of intermediate servers 10 can be provided throughout the country of Japan. If intermediate servers 10 are installed in the vicinity of devices 30, millions of intermediate servers 10 can be provided.

The first device 301 and the second device 302 may incorporate mutually different packet caches. When the first device 301 and second device 302 generate mutually different data, the reduction ratio of the communication traffic between the device 301 and intermediate server 10 will differ from the reduction ratio of the communication traffic between the device 302 and intermediate server 10.

The operation of the system 1 will be further explained in detail, focusing on operation 1-1 relating to the devices 30, operation 1-2 relating to the intermediate server 10, and operation 1-3 relating to the central server 20.

(2) Devices

Figure 7B:
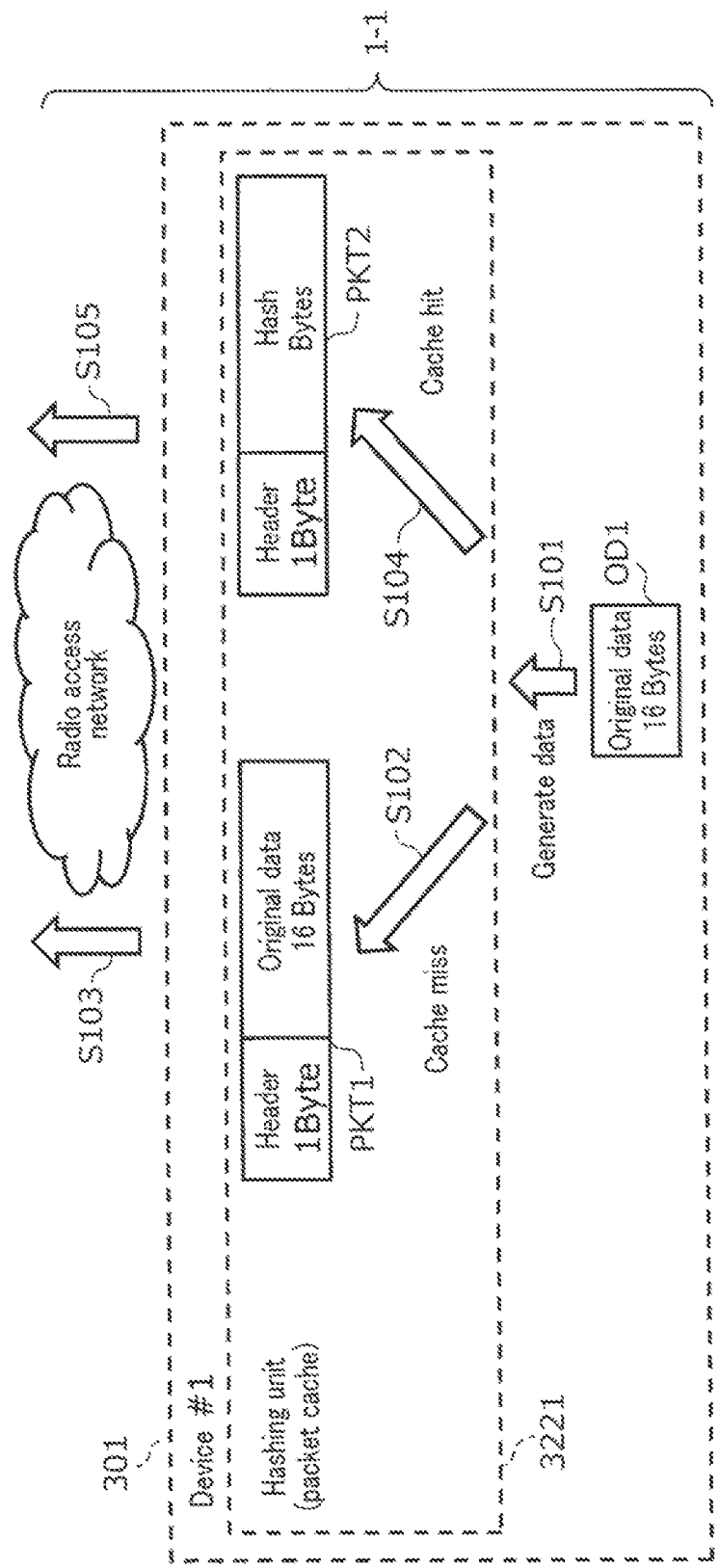
FIG. 7B is a diagram showing the details of the data flow in the device shown in FIG. 7A.

FIG. 7B is a diagram showing the operation 1-1 relating to the devices 30 or to the first device 301, in particular.

First at step S101, the device 301 captures sensing signals from the sensors 61 to 6k in the sensor group 60 via the sensor interface 311, samples the signals at a predetermined sampling rate, and generates 16-byte original data OD1, under the control of the sensing data generation unit 321. This data size of 16 bytes is presented merely as an example, and the data size of the embodiment is not limited to 16 bytes.

Next, the device 301 adopts packet caching for the generated original data OD1 under the control of the hashing unit 322.

FIG. 8 is a process flow chart for explaining the mechanism of packet caching.

In this example, traffic TF1 flowing through a broad-band network BN1 passes through a narrow-band network NN between the first device PC1 and the second device PC2, and then through a broad-band network BN2. The first device PC1 and second device PC2 each having a packet caching capability are provided at the two ends of the network. "Cache A" and "cache B" are both stored in advance in both of the first device PC1 and second device PC2.

When the traffic (original traffic) TF1 passing through the two devices, namely the first device PC1 and second device PC2, contains the same data as that in the "cache A", the original traffic TF1 is not transmitted and received between the two devices. Instead, transmission and reception is conducted by converting the same portion as the data in the cache A of the original traffic to index information (hash) HA1 of the cache A.

Index information (hash or hash value) indicates the physical position where a specific cache appears in the packet caching, by aligning the caches in a predetermined order so that the specific cache can be quickly referred to. In general, the size of the index information (hash) is smaller than that of the data of the cache itself.

When the data in the original traffic TF1 contains the same data as the data in the caches of the first device PC1 and the second device PC2, the data from which the redundancy is eliminated is transmitted and received between the first device PC1 and second device PC2.

For instance, when the second device PC2 receives data TF2 in which redundancy is eliminated from the original traffic TF1 as in FIG. 8, the data of the cache A itself can be looked up by the index information (hash) of the cache A in the redundancy-eliminated data, thus recovering the original traffic TF3. With this effect, the traffic can be reduced between the two devices PC1 and PC2 (i.e., in the narrow-band network NN), without losing the information amount (meaning) of the original traffic TF1.

In FIG. 7B, when the 16-byte original data OD1 is not cached (in other words, when the hashing unit 3221 determines that the original data OD1 is not contained in the correspondence table stored in the correspondence table memory 332), the device 301 proceeds to step S102 (cache miss) to execute the process of updating the correspondence table under the control of the hashing unit 3221, and forwards the data OD1 to the packet output unit 323. Thus, 17-byte data packet PKT1 is generated by adding 1-byte header information to the 16-byte data OD1 under the control of the packet output unit 323.

Thereafter, at step S103, the device 301 transfers the generated data packet PKT1 to the intermediate server 10 under the control of the transmission control unit 324.

Each time the hashing unit 3221 receives data that is not contained in the correspondence table, the hashing unit 3221 may delete the oldest information from the correspondence table and add the correspondence of the newly obtained data and a hash value, thereby updating the correspondence table. In FIG. 7B, for the sake of clear explanation, the data up to the state of packets being generated by the packet output unit 323 after the process performed by the hashing unit 3221 is illustrated as the data in the hashing unit 3221.

On the other hand, when 16-byte original data OD1 is cached (in other words, when the hashing unit 3221 determines that the original data OD1 is contained in the correspondence table stored in the correspondence table memory 332), the device 301 proceeds to step S104 (cache hit), converts the 16-byte data to a 2-byte hash under the control of the hashing unit 3221, and adds 1-byte header information to generate data packet PKT2 of 3 bytes in total under the control of the packet output unit 323.

Thereafter, at step S105, the device 301 transfers the generated data packet PKT2 to the intermediate server 10 under the control of the transmission control unit 324.

(3) Intermediate Server

Figure 7C:
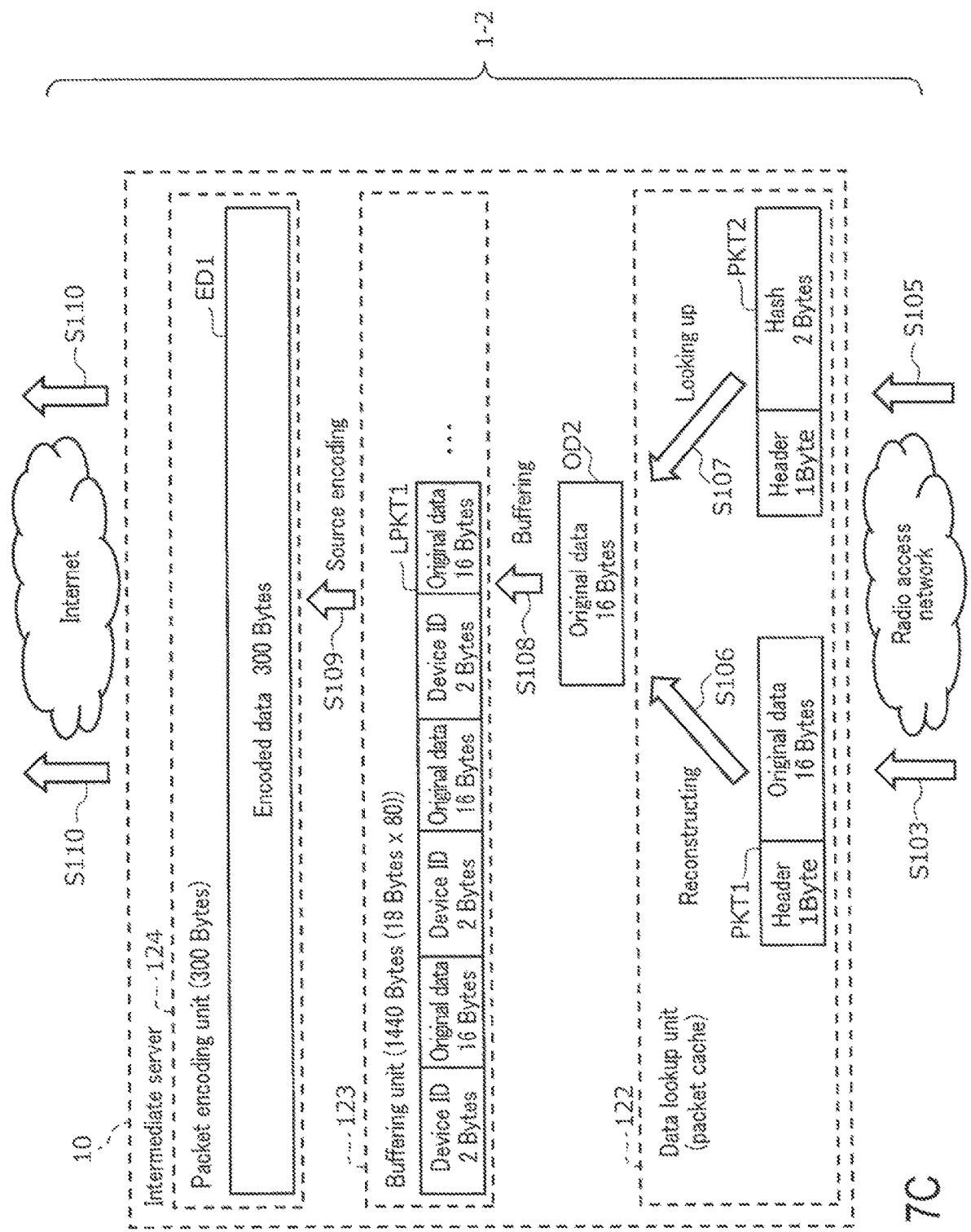
FIG. 7C is a diagram showing the details of the data flow in the intermediate server in FIG. 7A.

FIG. 7C is a diagram showing an example of the operation 1-2 relating to the intermediate server 10.

When the intermediate server 10 receives from the device 301 the 17-byte data packet PKT1 generated as a result of the cache miss at step S103, the intermediate server 10 reconstructs, at step S106, 16-byte original data OD2 by deleting the 1-byte header information from the received 17-byte packet PKT1 under the control of the packet-cached data lookup unit 122.

On the other hand, when the intermediate server 10 receives the 3-byte data packet PKT2 generated as a result of the cache hit from the device 301 at step S105, the intermediate server 10 removes the 1-byte header information from the received 3-byte packet PKT2 and looks up 16-byte original data OD2 from the 2-byte hash based on the correspondence table at step S107 under the control of the packet-cached data lookup unit 122. The hash size of 2 bytes is given as an example, and any size can be determined for a hash.

The device 30 (first device 301) and intermediate server 10 are originally meant to transmit and receive 16-byte data. In case of a cache miss, however, 17-byte data needs to be transmitted and received. That is, frequent cache misses will increase the communication traffic between the devices 30 and the intermediate server 10. On the other hand, in case of a cache hit, data of only 3 bytes in place of 16 bytes needs to be transmitted and received. With sufficient cache hits, the communication traffic between the devices 30 and the intermediate server 10 can be significantly reduced.

Thereafter, at step S108, the intermediate server 10 buffers the 16-byte data generated by the devices 30 (301 to 30n) until it reaches a certain size under the control of the buffering unit 123. For instance, the buffering unit 123 may perform buffering until the data size reaches 1440 bytes so as to be fitted in a single Ethernet frame, thereby generating a 1440-byte long packet LPKT1.

When buffering on the intermediate server 10, if the 16-byte data generated by the devices 30 (301 to 30n) is buffered as is, it will become indistinguishable as to which of the devices 30 generates which of the buffered 16-byte data. For this reason, a 2-byte device ID is added to the 16-byte data such that which of the devices 30 generates the buffered 16-byte data can be identified. The devices 30 and the intermediate server 10 may exchange information regarding the device ID at the time of initiating the communication, and the intermediate server 10 can thereby ascertain the device ID of each device 30.

Next, at step S109, the intermediate server 10 executes a packet encoding compression upon the 1440-byte long packet LPKT1 generated by the buffering unit 123, under the control of the packet encoding unit 124. Here, the packet encoding unit 124 attempts to compress the 1440-byte data employing the source encoding scheme. However, to what size the data can be compressed depends on the content of the data (alignment of byte strings). The data may be compressed approximately to one-hundredth, or may be scarcely compressed. It is assumed here that the data is compressed approximately to one-fifth and that the size of the encoded data ED1 that has been compressed by the packet encoding unit 124 is 300 bytes.

Thereafter, at step S110, the intermediate server 10 transfers the compressed 300-byte encoded data ED1 to the central server 20 under the control of the transmission control unit 125.

(4) Central Server

Figure 7D:
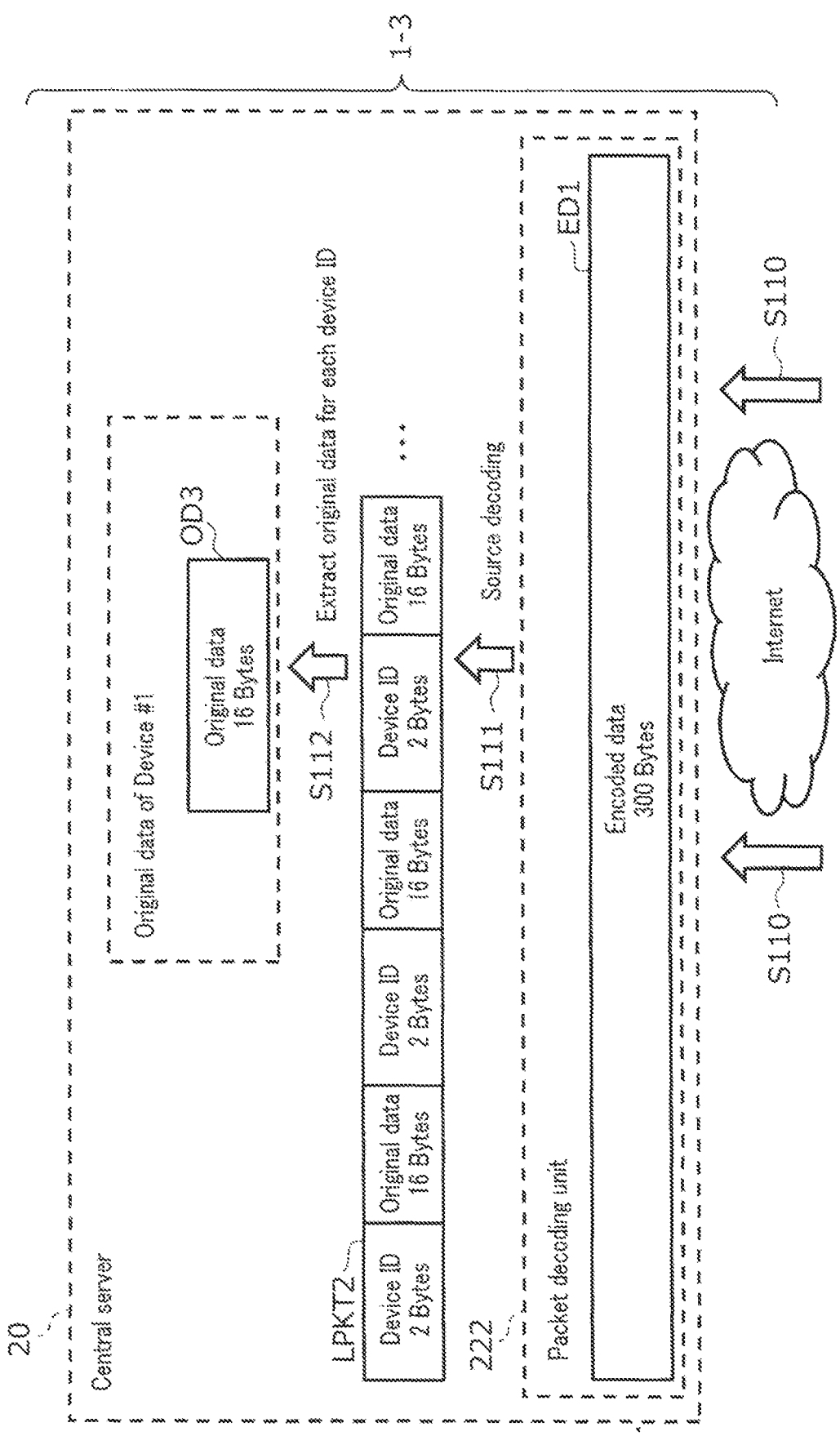
FIG. 7D is a diagram showing the details of the data flow in the central server in FIG. 7A.

FIG. 7D is a diagram showing an example of the operation 1-3 relating to the central server 20.

When the central server 20 receives the 300-byte encoded data ED1 from the intermediate server 10 at step S110, the 300-byte data ED1 is decompressed by employing the source decoding scheme at step S111 under the control of the packet decoding unit 222. In the decompressed data LPKT2, multiple combinations of a 2-byte device ID and 16-byte original data are buffered.

Thereafter, at step S112, the central server 20 sorts the 16-byte original data in accordance with the device IDs to reconstruct the data generated by the respective devices 30 and obtain original data OD3 generated by the first device 301, under the control of the original data extraction unit 223.

(5) Control Server

FIG. 9 is a flowchart showing an exemplary procedure and descriptions of the processing for generation of a control signal by the control server 40.

At step S201, the control server 40 acquires a presence/absence of a trigger for initiating the process. During this state, when a trigger is received, for example from a timer (not shown) that generates a trigger at certain intervals, the process is initiated as indicated below.

First, at step S202, the control server 40 acquires the load states of the monitoring target computers and stores them in the load state memory 431 under the control of the load state acquisition unit 421. According to the embodiment, the control server 40 is communicably connected to the intermediate server 10 so that the load state of the intermediate server 10 can be acquired directly from the intermediate server 10. The control server 40 can also acquire the load states of the devices 30 and central server 20 via the intermediate server 10. For this acquisition, the intermediate server 10 is configured to regularly acquire the load state such as the CPU activity and the amount of memory use from the devices 30 and central server 20. Alternatively, the control server 40 may acquire the corresponding load state by directly communicating with the devices 30 and central server 20 through the network NW.

Next, at step S203, the control server 40 reads the load state from the load state memory 431, compares it with the predetermined threshold value, and thereby determines whether or not an overload state is detected for each computer, under the control of the packet cache control unit 422, buffering control unit 423, and packet encoding control unit 424. For instance, when the CPU activity and the amount of memory use of a specific computer both fall below the corresponding predetermined threshold values, the control server 40 determines that the computer is not in an overload state. The control server 40 may be configured to collectively determine the overload states of all the computers, or each of the control units 422 to 424 may be configured to determine the overload state of one or more computers based on the corresponding standards. If no overload state is detected, the process is terminated, and the system stays on standby until the next trigger is received.

On the other hand, when an overload state is detected at step S203, the control server 40 determines at step S204 a suitable control based on the predetermined control standards under the control of the packet cache control unit 422, buffering control unit 423, and packet encoding control unit 424, and generates and outputs a control signal to a control-targeted computer under the control of the control signal output control unit 425.

The control standards for the determination of overload by the control units 422 to 424 and the generation of a control signal by the control signal output control unit 425 may be freely preset by a system designer or the like. For instance, when an overload state of a certain device 301 is detected, a control signal may be generated and output to the intermediate server 10 to which this device 301 is connected and to all the devices 302, . . . 30*n* connected to this intermediate server 10, to instruct to terminate the packet caching and transmit the data as is without hashing. For instance, in response to the determination of an overload state for a certain device 301, the packet cache control unit 422 may output to the control signal output control unit 425 an instruction for terminating the packet caching operation. Upon receipt of this instruction, the control signal output control unit 425 may generate and transmit to the targeted computers (devices 301, 302, . . . 30*n* and to the intermediate server 10) a control signal for instructing to transmit data without executing a hashing process.

When an overload state is detected in the intermediate server 10, a control may be performed such that no buffering process is executed upon the intermediate server 10 for a certain length of time. Alternatively, a control may be performed such that the intermediate server 10 transfers the data to the central server 20 without executing buffering and encoding processes until the overload state of the intermediate server 10 is resolved. For instance, in response to the determination of the intermediate server 10 being in an overload state, the buffering control unit 423 and packet encoding control unit 424 output an instruction to the control signal output control unit 425 to terminate the buffering and packet encoding operations. Upon receipt of this instruction, the control signal output control unit 425 generates and transmits a control signal to the targeted computer (intermediate server 10) to instruct to transmit data without executing a buffering process or a compression encoding process.

When an overload state is detected in the central server 20, an instruction may be issued to a randomly selected half of the intermediate servers 10 connected to the central server 20 to transfer data to the central server 20 without executing an encoding process. Alternatively, the optimization control may be performed through reinforcement learning or any other machine learning scheme to obtain an optimal solution that can alleviate the load of the computer.

(Effects)

As described above, according to the embodiment of the invention, the data compression transmission system 1 for collecting the data generated by multiple devices 30 at the central server 20 through the network NW can be offered, wherein the system includes an intermediate server 10 arranged between the devices 30 and central server 20. In such a data compression transmission system 1, with a packet caching capability, each of the devices 30 stores a correspondence table indicating the correspondence between original data and hash values obtained from the original data, and, when the transmission target data is contained in the correspondence table, the device 30 outputs a data packet by converting this data to a hash value and adds header information thereto. Furthermore, in the data compression transmission system 1, with a packet caching capability, the intermediate server 10 receives data packets transmitted from the respective devices 30, deletes the header information from the received data packets, and if the remaining data contains a hash value, converts the hash value to the original data to recover the data. With buffering capability, the intermediate server 10 also buffers the recovered data and outputs it as a long packet (aggregated data). The intermediate server 10 compresses and encodes the long packet, and outputs it as encoded data.

In a conventional system without an intermediate server 10, the packet caching capability is provided in the devices 30 and central server 20. In the conventional system without an intermediate server 10, the buffering capability is also provided in the devices 30. If the first device 301 and second device 302 have different packet caches and generate different data, the communication traffic reduction ratio between the packet cache of the first device 301 and the packet cache of the central server 20 differs from the communication traffic reduction ratio between the packet cache of the second device 302 and the packet cache of the central server 20. Similarly, if the first device 301 and second device 302 have different buffering devices and generate different data, the reduction ratio in the number of packets between the packet cache of the first device 301 and the packet cache of the central server 20 differs from the reduction ratio in the number of packets between the packet cache of the second device 302 and the packet cache of the central server 20.

For such a conventional system, the device 30 continues buffering upon the generated 16-byte data until the data reaches a packet of a certain size. For instance, buffering may be continued until the size of the data reaches 1440 bytes so as to be fitted into a single Ethernet frame. If the buffered 1440-byte data is not stored in the packet cache (cache miss), 1-byte header information is added to the 1440-byte data so as to transfer the 1441-byte data to the central server 20. The central server 20 deletes the 1-byte header information from the received 1441-byte data to recover the original data. On the other hand, if the buffered 1440-byte data is stored in the packet cache (cache hit), the 1440-byte data is converted to a 2-byte hash, and 1-byte header information is added thereto so that 3-byte data can be transferred to the central server 20. The central server 20 deletes the 1-byte header information from the received 3-byte data, thereby looking up the original data from the hash.

As mentioned above, packet caching is a scheme for compressing temporal redundancy indicating repeated transmissions of the same data in the past. If the data is small, the possibility of repeating the transmission of the same data is high. If the data is large, however, data having a 1-byte difference is dealt with as different data. Then, the compression with packet caching will not prove to be effective.

In contrast, in the data compression transmission system 1 according to the present embodiment, packet caches are provided in the device 30 and intermediate server 10. When the device 30 repeats the transmission of the same data to the intermediate server 10, temporal redundancy occurs in the data. With packet caching, the communication traffic can be reduced.

Furthermore, in the data compression transmission system 1 according to the present embodiment, a buffering unit is arranged in the intermediate server 10. The device 30, which does not include a buffering unit, compresses the unbuffered data through packet caching, and transmits the data to the intermediate server 10. The intermediate server 10 performs buffering upon the data received from the devices 30, and converts small-sized data (short packet) to large-sized data (long packet).

In the data compression transmission system 1 according to the present embodiment, the packet encoding unit and decoding unit are arranged in the intermediate server 10 and central server 20. The data buffered by the intermediate server 10 is compressed through packet encoding, and transmitted from the intermediate server 10 to the central server 20.

Furthermore, the data compression transmission system 1 according to the present embodiment includes three functional units, the packet cache control unit, packet encoding control unit, and buffering control unit. With these units, the devices 30, intermediate server 10 and central server 20 can be prevented from falling into an overload state due to the data compressing and buffering processes.

The amount of data generated by the devices 30 may vary with time. If the devices 30 move geographically, the numbers of devices 30 connected to one intermediate server 10 may fluctuate among the intermediate servers 10. In the field of IoT or the like, loads placed on the devices 30, intermediate server 10 and central server 20 continuously change, and therefore there is no definite solution regarding what level of capability the hardware should be prepared with. For this reason, if the hardware is likely to be in an overload state, the data is transferred as is without performing data compression or buffering. In this manner, the overload state of the hardware can be prevented. Furthermore, if a network is in an overload state with a large amount of data flowing through, a scheme of switching to an algorithm, which may increase the computing load but will improve the compression efficiency, may be adopted. In the data compression transmission system according to the present embodiment, the optimal data compression can be realized in the overall architecture, while balancing the capability of computers and the capability of networks.

In the field of IoT or the like, most data generated by devices has a small size, and is generated frequently. In order to compress the frequently generated data of a small size, compression with packet caching is effective. With conventional packet caching only, however, the number of packets cannot be reduced. Unlike in the conventional system, an intermediate server 10 having the packet caching, buffering and packet encoding capabilities is arranged in a section between the devices 30 and the central server 20 in the present invention. Thus, the overall architecture can be achieved with the reduced communication traffic, the reduced number of to-be-communicated packets, and the reduced number of network connections, and at the same time, with the real-time performance ensured.

Furthermore, by providing the intermediate server 10 with the capabilities of the devices 30 of the conventional system, the capabilities of the devices 30 can be simplified, and the cost and maintainability of each device 30 can be improved. Since the intermediate server 10 is excellent in cost and maintainability in comparison to the devices 30, the system deploying the intermediate servers 10 is highly feasible in the aspect of commercialization and the like.

With the above data compression transmission system 1 according to the present embodiment, the three issues of the conventional system can be solved as indicated below.

[Solution to Issue 1]

The conventional system may be able to reduce the communication traffic between the devices 30 and central server 20 by applying packet caching to the communication between the devices 30 and central server 20. This, however, does not change the number of to-be-communicated packets, and therefore increases the cost of collecting data from the devices 30 at the central server 20.

In contrast, the data compression transmission system 1 according to the present embodiment performs packet caching in the section between the devices 30 and intermediate server 10, and buffers the data of the devices 30 in the intermediate server 10 to compress the data at the packet encoding unit 124. In other words, compression through packet caching is performed in the section between the device 30 and the intermediate server 10, while compression through packet encoding is performed in the section between the intermediate server 10 and the central server 20. Since the data compression can be performed in all the sections between the devices 30 and intermediate server 10 and between the intermediate server 10 and central server 20, the communication traffic can be reduced in all the communication paths.

Furthermore, in the data compression transmission system 1, the number of packets can be reduced in the section between the intermediate server 10 and central server 20. In the example of FIGS. 7A to 7D, when the data of 80 devices is to be buffered in the intermediate server 10, the 16-byte data generated by the 80 devices can be fitted into a single packet (1440 bytes) at the intermediate server 10 so that the number of to-be-communicated packets that enter the central server 20 can be reduced to one eightieth. In this manner, not only the communication traffic but also the number of packets can be reduced in the section between the intermediate server 10 and the central server 20.

Furthermore, in the data compression transmission system 1, compression through packet caching is performed in the section between the devices 30 and the intermediate server 10 in a manner similar to the conventional system. Since the number of to-be-communicated packets is unchanged, the number of to-be-communicated packets in the section between the devices 30 and the intermediate server 10 cannot be reduced when viewed as the entire system. However, a larger number of intermediate servers 10 than the number of central servers 20 can be installed. For instance, in a conventional system without an intermediate server, which includes one thousand devices 30 and a single central server 20, communication packets from the thousand devices 30 enter the central server 20 at once. In contrast, if the data compression transmission system 1 includes a thousand devices 30, a single central server 20, and ten intermediate servers 10, the load of the communication packets from the thousand devices 30 can be distributed to the ten intermediate servers 10. Thus, the number of to-be-communicated packets in a section between the devices 30 and an intermediate server 10 can be reduced to one tenth.

As described above, with a plurality of intermediate servers 10 installed in the section between the devices 30 and the central server 20, the communication packets from the devices are buffered at these intermediate servers 10, thereby realizing both a reduction in the communication traffic and a reduction in the number of to-be-communicated packets.

[Solution to Issue 2]

In a conventional system, the number of to-be-communicated packets can be reduced by buffering the data on the devices 30, but the data buffering causes a delay time. In the use case prioritizing the real-time performance, buffering cannot be adopted to reduce the number of to-be-communicated packets.

In the data compression transmission system 1 according to the present embodiment, the data of the devices 30 is buffered on the intermediate servers 10, instead of the devices 30 performing data buffering. In the conventional system, where the data generated by one device is buffered by the device itself until the data reaches a sufficient size, the buffering delay time increases. In contrast, if the data from the devices 30 is aggregated on the intermediate servers 10, a large volume of data can be received and buffered in a short length of time. Thus, a delay time required for buffering can be reduced. For instance, when a single device 30 generates 10-byte data every second, the buffering delay time will be 100 seconds if the device buffers the data until it reaches 1000 bytes. On the other hand, if the data from a thousand devices 30 is aggregated at the intermediate server 10, the buffering delay time will be 0.1 seconds. With this effect, the data compression transmission system 1 can reduce the communication traffic and the number of to-be-communicated packets, while suppressing the influence of the buffering delay time even in the use case prioritizing the real-time performance.

[Solution to Issue 3]

In a conventional system, the central server 20 needs to maintain network connections corresponding to the number of devices 30. In the field of IoT or the like in which hundreds of millions of devices 30 are involved, connection problems including C10M arise if a vast number of network connections are formed with the central server 20.

According to the embodiment of the invention, communications on a plurality of devices 30 can be aggregated at an intermediate server 10. If ten million devices 30 and a single central server 20 are involved with the ten million devices directly connected to the central server 20, ten million network connections are formed in the central server 20. In contrast, if ten million devices 30, a single central server 20, and a thousand intermediate servers 10 are involved, a thousand network connections are formed in the central server 20. With the communications of the ten million devices 30 aggregated and buffered by the thousand intermediate servers 10, the number of network connections can be significantly reduced at the intermediate servers 10 and at the central server 20.

In one aspect of the embodiment, the central server 20 may include a decoding unit 222 configured to decode the encoded data transmitted from the intermediate server 10 and generate aggregated data.

According to this aspect, the central server 20 decodes the data compressed and encoded by the intermediate server 10, and generates aggregated data of a pre-encoding state. In this manner, the data of the pre-encoding state can be collected and stored at the central server 20 while reducing the amount of communications between the intermediate server 10 and central server 20.

In another aspect of the embodiment, the data compression transmission system 1 may further include a load state acquisition unit 421 configured to acquire the load state of at least one of the devices 30, intermediate servers 10, and central server 20; and a processing control unit 422, 423 or 424 configured to generate and output, in accordance with the acquired load state, a first control signal for instructing to transmit data without executing the hashing process, a second control signal for instructing to output data without executing the buffering process, or a third control signal for instructing to transmit data without executing the compression encoding process.

According to this aspect, the load state of at least one of the devices 30, intermediate servers 10 and central server 20 can be acquired, and in response to the acquired load state, a control signal for instructing to transmit and output data without executing a hashing process, buffering process or compression encoding process can be generated and output. In this manner, the control of the compressing process can be realized in accordance with the load state of each computer so that the data can be compressed and transmitted while alleviating the load of each computer.

According to still another aspect of the embodiment, the intermediate server 10 is arranged between the devices 30 configured to convert the generated data to a hash value based on a cache and to generate and transmit a packet including the hash value, and the central server 20 configured to collect the data generated by the devices 30 through a network. The intermediate server 10 may include a reception unit 121 for receiving the packet including the hash value and transmitted from the respective devices 30; a data lookup unit 122 for looking up the original data by the hash value included in the received packet; a buffering unit 123 for executing a buffering process to aggregate and output the looked-up original data as aggregated data; a compression encoding unit 124 for executing a compression encoding process to compress the output aggregated data and generate encoded data; and a transmission unit 125 for transmitting the encoded data to the central server.

In this manner, the data compression transmission system including a plurality of devices, a central server, and intermediate servers arranged in between allows for effective reduction in the communication traffic and the number of packets while ensuring the real-time performance required when collecting data from IoT devices.

According to still another aspect of the embodiment, the intermediate server 10 may further include a load state acquisition unit 421 configured to acquire the load state of at least one of the devices 30, intermediate servers 10, and central server 20; and a processing control unit 422, 423 or 424 configured to generate and output, in accordance with the acquired load state, a first control signal for instructing to transmit data without executing the process for converting the data to a hash value, a second control signal for instructing to output data without executing the buffering process, or a third control signal for instructing to transmit data without executing the compression encoding process.

In this manner, the compressing process can be controlled in accordance with the load state of each computer so that the data compression and transmission can be performed while alleviating the load of each computer.

OTHER EMBODIMENTS

The present invention is not limited to the above embodiment.

For instance, as mentioned earlier, the control server 40 is not an essential component for the data compression transmission system 1. The functional units of the control server 40 may be provided in the control unit 12 of an intermediate server 10, or in the control unit 212 of the central server 20. Alternatively, the units may be arranged in a distributed manner over other edge servers.

The mode of the network connection between the devices 30 and central server 20 and the mode of connections with the intermediate server 10 as explained above are mere examples, and are not limited to the above modes.

The functional units of the devices 30, central server 20 and intermediate server 10 may be distributed to cloud computers and edge routers in a manner such that these devices can function through cooperation with each other to execute the processes.

In addition to the above, the format of the correspondence table for hashing and the timings for updating the correspondence table can be modified in various manners without departing from the gist of the invention.

The program for realizing the above process may be stored and provided in a computer-readable storage medium (recording medium). The program is stored in a storage medium in the form of a file of an installable format or executable format. Examples of storage media include a magnetic disk, an optical disk (e.g., CD-ROM, CD-R, DVD-ROM, DVD-R), a magneto-optical disk (e.g., MO), and a semiconductor memory. In addition, the program that realizes the above process may be stored in a computer (server) connected to a network such as the Internet so that the program can be downloaded to a computer (client) via the network.

The present invention should not be limited to the above-described embodiments as-is, but may be embodied by modifying the components without departing from the scope of the invention at the implementation stage. In addition, various inventions may be constituted by appropriately combining a plurality of components disclosed in the embodiments. For example, some components may be omitted from the components shown in the embodiments. Furthermore, the components of different embodiments may be suitably combined.

REFERENCE SIGNS LIST

1 Data compression transmission system
10 Intermediate server
11 Communication interface
12 Control unit
12A Hardware processor
12B Program memory
13 Data memory
20 Central server
30, 301, 302, 30*n* Devices
40 Control server
50 Bus
60 Sensor group
61 to 6*k* Sensors
71 Input device
72 Output device
121 Data packet acquisition unit
122 Data lookup unit
123 Buffering unit
124 Packet encoding unit
125 Transmission control unit
131 Data packet memory
132 Correspondence table memory 210 Communication interface
212 Control unit
220 Control unit
221 Encoded data acquisition unit
222 Packet decoding unit
223 Original data extraction unit
224 Output control unit
230 Data memory
231 Encoded data memory
232 Original data memory
310 Communication interface
311 Sensor interface
312 Input/output interface
320 Control unit
321 Sensing data generation unit
322 Hashing unit
323 Packet output unit
324 Transmission control unit
330 Data memory
331 Sensing data memory
332 Correspondence table memory
410 Communication interface
420 Control unit
421 Load state acquisition unit
422 Packet cache control unit
423 Buffering control unit
424 Packet encoding control unit
425 Control signal output control unit
430 Data memory
431 Load state memory
432 Control signal memory
3221, 3222 Hashing units

The invention claimed is:

1. A data compression transmission system comprising:
a plurality of devices;
a central server that collects data generated by the devices via a network; and
an intermediate server arranged between the devices and the central server,
at least one of the devices comprising:
   a hashing unit configured to perform a hashing process to convert generated data to a hash value based on a cache; and
   a first transmission unit configured to generate a packet including the hash value and transmit the packet to the intermediate server, and
the intermediate server comprising:
   a reception unit configured to receive the packet transmitted from the at least one of the devices;
   a data lookup unit configured to look up original data from a cache table by the hash value included in the received packet;
   a buffering unit configured to perform a buffering process in a manner such that a plurality of pieces of the looked-up original data are aggregated and output as aggregated data;
   a compression encoding unit configured to perform a compression encoding process to compress the output aggregated data and generate encoded data; and
   a second transmission unit configured to transmit the encoded data to the central server.

2. The data compression transmission system according to claim 1, wherein
the central server comprises a decoding unit configured to decode the encoded data transmitted from the intermediate server and generate the aggregated data.

3. The data compression transmission system according to claim 1, one of the intermediate server and the central server further comprising:
   a load state acquisition unit configured to acquire a load state of at least one of the intermediate server, the central server, and the devices; and
   a processing control unit configured to generate and output, in accordance with the acquired load state, a first control signal that instructs to transmit data without executing the hashing process, a second control signal that instructs to output data without executing the buffering process, or a third control signal that instructs to transmit data without executing the compression encoding process.

4. An intermediate server arranged between a plurality of devices and a central server, the intermediate server comprising:
   a reception unit configured to receive a packet from at least one of the plurality of devices, the packet including a hash value, the hash value being converted from generated data based on a cache by the at least one of the plurality of devices;
   a data lookup unit configured to look up original data from a cache table by the hash value included in the received packet;
   a buffering unit configured to perform a buffering process in a manner such that a plurality of pieces of the looked-up original data are aggregated and output as aggregated data;
   a compression encoding unit configured to perform a compression encoding process to compress the output aggregated data and generate encoded data; and
   a transmission unit configured to transmit the encoded data to the central server that collects the data generated by the devices via a network.

5. The intermediate server according to claim 4, further comprising:
   a load state acquisition unit configured to acquire a load state of at least one of the intermediate server, the central server, and the devices; and
   a processing control unit configured to generate and output, in accordance with the acquired load state, a first control signal that instructs to transmit data without executing a process for converting to the hash value, a second control signal that instructs to output data without executing the buffering process, or a third control signal that instructs to transmit data without executing the compression encoding process.

6. A non-transitory computer readable medium storing a computer program which is executed by a computer, the computer being included in an intermediate server arranged between a plurality of devices and a central server, and causes the computer to:
   receive a packet from at least one of the plurality of devices, the packet including a hash value, the hash value being converted from generated data based on a cache by the at least one of the plurality of devices;
   look up original data from a cache table by the hash value included in the received packet;
   perform a buffering process in a manner such that a plurality of pieces of the looked-up original data are aggregated and output as aggregated data;

perform a compression encoding process to compress the output aggregated data and generate encoded data; and transmit the encoded data to the central server that collects the data generated by the devices via a network.

\* \* \* \* \*